United States Patent [19]
Nitta

[11] Patent Number: 5,397,935
[45] Date of Patent: Mar. 14, 1995

[54] BIAS CURRENT SUPPLYING CIRCUIT
[75] Inventor: Shozo Nitta, Kita, Japan
[73] Assignee: Kabushiki Kaisha Toshiba, Kawasaki, Japan
[21] Appl. No.: 33,890
[22] Filed: Mar. 18, 1993
[30] Foreign Application Priority Data
  Mar. 27, 1992 [JP] Japan .................. 4-071702
[51] Int. Cl.⁶ .............. H03K 5/01; H03K 5/153; H03K 17/687
[52] U.S. Cl. .................. 327/544; 327/538; 327/63; 327/65
[58] Field of Search .............. 307/359, 362, 296.3, 307/296.6

[56] References Cited
U.S. PATENT DOCUMENTS
| | | | |
|---|---|---|---|
| 4,642,482 | 2/1987 | Kasperkovitz et al. | 307/362 |
| 4,972,103 | 11/1990 | Barbu | 307/359 |
| 5,189,318 | 2/1993 | Tanaka | 307/362 |

Primary Examiner—William L. Sikes
Assistant Examiner—Fetsum Abraham
Attorney, Agent, or Firm—Foley & Lardner

[57] ABSTRACT

A bias current supplying circuit having: a differential amplifier for amplifying a difference between potentials at first and second nodes and outputting the amplified difference voltage from a third node, the first node being connected to an output terminal of a bias voltage source for outputting a bias voltage, and the second node being connected to an output terminal from which a bias current is supplied to an external circuit; a negative feedback loop circuit for changing the potential at the second node in accordance with the potential at the third node of the differential amplifier; and a potential dropping circuit connected to the second node for dropping the potential at the second node in response to an external input of a control signal and intercepting a supply of the bias current to the external circuit.

12 Claims, 2 Drawing Sheets

BIAS CURRENT SUPPLYING CIRCUIT

BACKGROUND OF THE INVENTION

The present invention relates to a circuit for supplying bias current.

An emitter coupled logic (ECL) gate circuit, for example, requires a bias current for the operation thereof. The bias current is supplied from an additionally provided bias voltage source.

Conventionally, a bias current is always supplied to all of a plurality of ECL gate circuits irrespective of the operation state of each ECL circuit. Since bias current is continuously supplied even when an ECL circuit is not operating, the current is wastefully consumed. ECL gate circuits generally consume the same current irrespective of whether or not the circuit block is operating, posing a significant obstruction to reducing power consumption of the whole circuit.

SUMMARY OF THE INVENTION

An objective of the present invention is to provide a bias current supplying circuit capable of reducing power consumption.

According to the present invention, there is provided a bias current supplying circuit comprising: a differential amplifier for amplifying a difference between potentials at first and second nodes and outputting the amplified difference voltage from a third node, the first node being connected to an output terminal of a bias voltage source for outputting a bias voltage, and the second node being connected to an output terminal from which a bias current is supplied to an external circuit; a negative feedback loop circuit for changing the potential at the second node in accordance with the potential at the third node of the differential amplifier; and potential dropping means connected to the second node for dropping the potential at the second node in response to an external input of a control signal and intercepting a supply of the bias current to the external circuit.

As a bias voltage of the bias voltage source is input to the first node of the differential amplifier and the potential at the first node relatively changes from the potential at the second node connected to the output terminal, the potential at the third node changes with the difference between potentials at the first and second nodes. The negative feedback loop circuit changes the potential at the second node in accordance with the potential at the third node. If the control signal is not input to the potential dropping means, a bias current is supplied to the external circuit from the output terminal connected to the second node. When the control signal is input to the potential dropping means, the potential at the second node lowers to stop supplying a bias current to the external circuit.

The differential amplifier may be constructed such that the potential at the third node rises when the potential at the first node rises above the potential at the second node, in accordance with a level difference between the potentials at the first and second nodes, and falls when the potential at the first node falls below the potential at the second node, in accordance with a level difference between the potentials at the first and second nodes. The negative feedback loop circuit may be constructed such that when the potential at the third node rises, the potential at the second node rises to a value substantially the same as the potential at the first node, and when the potential at the third node falls, the potential at the second node falls to a value substantially the same as the potential at the first node.

The differential amplifier may be constructed such that the base of a first transistor is connected to the first node, the base of a second transistor is connected to the second node, the emitters of the first and second transistors are connected in common via a first resistor to a second supply voltage terminal, the collector of the first transistor is connected to a first supply voltage terminal, the collector of the second transistor is connected to the third node, and the third node is connected via a second resistor to the first supply voltage terminal. The negative feedback loop circuit may be constructed such that the base of a third transistor is connected to the third node, the collector of the third transistor is connected to the first supply voltage terminal, and the emitter of the third transistor is connected via a third resistor to the second node. The potential dropping means may be constructed such that the collector of a fourth transistor is connected to the second node, the emitter of the fourth transistor is connected to the second supply voltage terminal, and the base of the fourth transistor is connected to a terminal to which the control signal is input.

In this case, a bias voltage is input via the first node from the bias voltage source. For example, if the bias voltage changes to a higher level, the collector current of the first transistor increases, whereas the collector current of the second transistor decreases. The potential at the third node connected to the base of the third transistor rises to increase the collector current of the third transistor, and the base potential of the second transistor rises to take the same level as the base potential of the first transistor. As above, because the potential at the second node changes with the potential at the first node, an output corresponding to the bias supply voltage is output from the second node. When the control signal is applied to the base of the fourth transistor serving as the potential dropping means, the potential at the second node falls to stop supplying a bias current to the external circuit, reducing power consumption.

DESCRIPTION OF THE PREFERRED EMBODIMENTS

Figure 1:
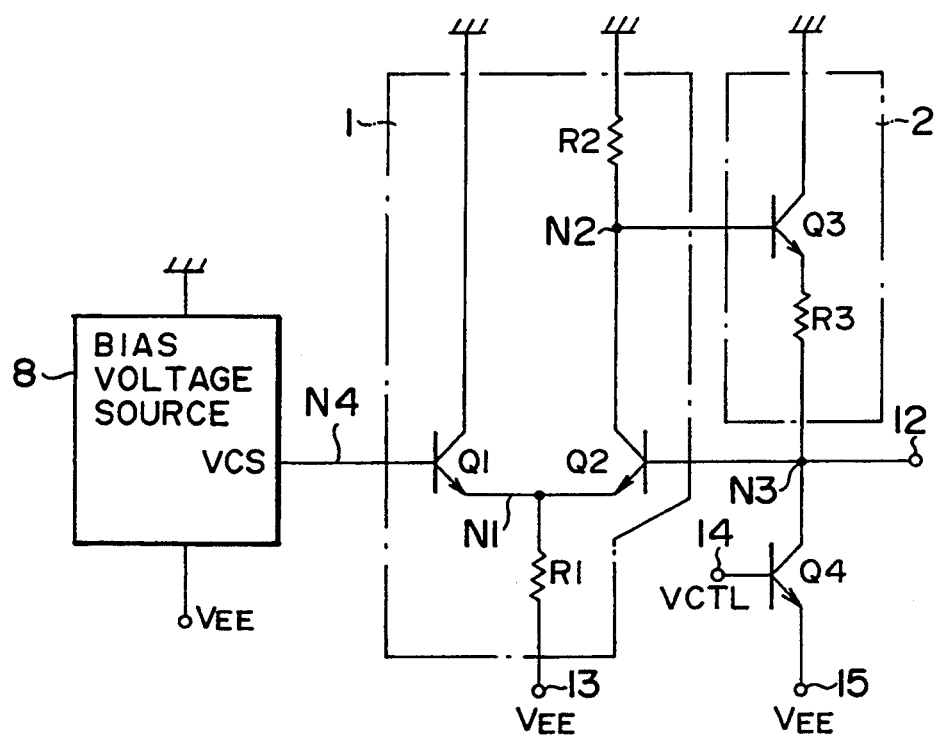
FIG. 1 is a circuit diagram showing the structure of a bias current supplying circuit according to an embodiment of the present invention.

An embodiment of the present invention will be described with reference to the accompanying drawings. FIG. 1 shows the structure of a bias current supplying circuit according to an embodiment of the present invention. This circuit is constructed of a differential amplifier 1, a negative feedback loop circuit 2, and a current pulling-out transistor Q4 as a potential dropping means.

The differential amplifier 1 has npn transistors Q1 and Q2, and resistors R1 and R2. The base of the transistor Q1 is connected via a node N4 to a bias voltage source 8, the collector is grounded, and the emitter is connected to a node N1. The base of the transistor Q2 is connected to a node N3, the collector is connected to a node N2, and the emitter is connected to the node N1. The resistor R2 is connected between the node N2 and ground. The node N3 is connected via an output terminal 12 to an external circuit to which bias current is supplied. The resistor R1 is connected between a negative supply voltage $V_{EE}$ terminal and the node N1 to which the emitters of the transistors Q1 and Q2 are connected in common.

The negative feedback loop circuit 2 has an npn transistor Q3 and a resistor R3. The base of the transistor Q3 is connected to the node N2 of the differential amplifier 1, the collector is grounded, and the emitter is connected via the resistor R3 to the node N3.

The base of the current pulling-out npn transistor Q4 is connected to a terminal to which a control signal $V_{CTL}$ is applied, the collector is connected to the node N3, and the emitter is connected to a supply voltage $V_{EE}$ terminal.

The bias current supplying circuit of this embodiment constructed as above operates as follows.

The operation when the control signal $V_{CTL}$ is not supplied from the external circuit and the transistor Q4 is non-conductive, will be first given below. A bias voltage $V_{CS}$ is supplied form the bias voltage source 8 via the node N4 to the base of the transistor Q1 of the differential amplifier 1. If the bias voltage $V_{CS}$ changes and the base potential of the transistor Q1 changes, the base potential of the transistor Q2 follows the base potential of the transistor Q1 and the operation of the differential amplifier 1 becomes stable. For example, when the bias voltage $V_{CS}$ rises and the base potential of the transistor Q1 rises, the collector current of the transistor Q1 increases and the collector current of the transistor Q2 decreases. The voltage drop across the resistor R2 decreases correspondingly to raise the potential at the node N2 connected to the collector of the transistor Q2. The base potential of the transistor Q3 connected to the node N2 rises correspondingly to increase the collector current of the transistor Q3. As a result, the base potential of the transistor Q2 rises to the base potential of the transistor Q1.

On the other hand, when the bias voltage $V_{CS}$ falls, the operations opposite to those described above are performed to lower the base potential of the transistor Q2 to the base potential of the transistor Q1.

As described above, under the condition that the current pulling-out transistor Q4 is being turned off, the base potential of the transistor Q2 changes to take the same potential as the bias voltage $V_{CS}$. Therefore, a voltage corresponding to the bias voltage $V_{CS}$ can be output from the output terminal 12 connected to the base of the transistor Q2, as in the case where the bias voltage $V_{CS}$ of the bias voltage source 8 is directly output to the external circuit.

When the control signal $V_{CTL}$ is applied to the base of the transistor Q4, the transistor Q4 becomes conductive and so the base potential of the transistor Q2 lowers to turn it off. As a result, the potential at the node N2 connected to the collector of the transistor Q2 rises to the ground potential. In this case, if the drive capacity of the transistor Q4 is set high, the base potential of the transistor Q2 lowers to about the supply voltage $V_{EE}$ with a voltage drop across the resistor R3. Therefore, a bias current will not be output from the output terminal 12 to the external circuit, completely cutting off the power otherwise consumed by this external circuit. If a bias current is to be supplied to this external circuit, the control signal $V_{CL}$ applied to the base of the transistor Q4 is intercepted to turn the transistor Q4 off.

Figure 2:
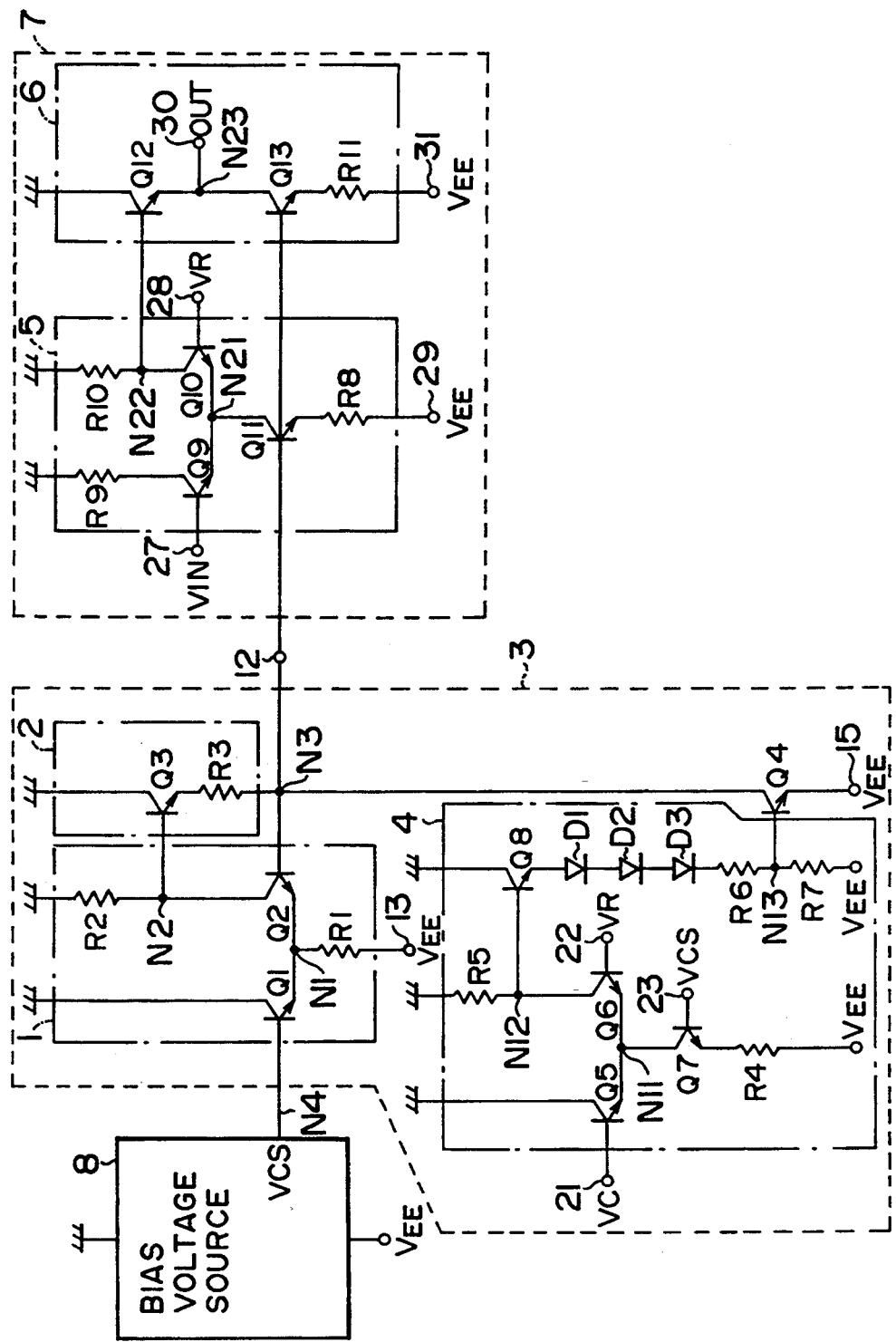
FIG. 2 is a circuit diagram showing the bias current supplying circuit and an example of a control signal generator circuit.

FIG. 2 shows a bias current supplying circuit 3 according to an embodiment of the present invention, and an example of the circuit structure of an ECL gate circuit 7 to be supplied with a bias current. The bias current supplying circuit 3 has the differential amplifier 1, negative feedback loop circuit 2, current pulling-out transistor Q4, respectively described above, and a control signal generator 4 for supplying a control signal to the transistor Q4.

The control signal generator 4 has npn transistors Q5 to Q8, resistors R4 to R7, and diodes D1 to D3. The base of the transistor Q5 is connected to a terminal 21 to which a signal $V_C$ is input, the collector is connected to a ground terminal, and the emitter is connected to a node N11. The base of the transistor Q6 is connected to a terminal 22 to which a reference signal $V_R$ is input, the collector is grounded via the resistor R5, and the emitter is connected to the node N11. Also connected to the node N11 is the collector of the transistor Q7 whose base is connected to a terminal 23 to which the bias voltage $V_{CS}$ is input and whose emitter is connected to a supply voltage $V_{EE}$ terminal via the resistor R4. The base of the transistor Q8 is connected to a node N12 connected to the resistor R5 and the collector of the transistor Q6, and the collector is connected to a ground terminal. Serially connected between the emitter of the transistor Q8 and a supply voltage $V_{EE}$ terminal are the diodes D1 to D3 and resistors R6 and R7. A node N13 interconnecting the resistors R6 and R7 is connected to the base of the current pulling-out transistor Q4.

The ECL gate circuit 7 has a current switching circuit 5 and an emitter follower 6. The current switching circuit 5 has npn transistors Q9 to Q11, and resistors R8 to R10. The base of the transistor Q9 is connected to a terminal 27 to which a signal VIN is input, the collector is connected to a ground terminal via the resister R9, and the emitter is connected to a node N21. The base of the transistor Q10 is connected to a terminal 28 to which the reference signal $V_R$ is input, the collector is grounded via the resistor R10, and the emitter is connected to the node N21. Also connected to the node N21 is the collector of the transistor Q11 whose base is connected to the output terminal 12 and whose emitter is connected to a supply voltage $V_{SE}$ terminal via the resistor R8.

The base of the transistor Q12 of the emitter follower 6 is connected to a node N22 interconnecting the collector of the transistor Q10 and the resister R10, the collector is grounded, and the emitter is connected to a node N23 connected to an output terminal 30. Also connected to the node N23 is the collector of the transistor Q13 whose base is connected to the base of the transistor Q11 and whose emitter is connected to a supply voltage $V_{EE}$ terminal via the resistor R11.

In the ECL gate circuit 7, the current switching circuit 5 and emitter follower 7 operate while a bias current is supplied to the bases of the transistors Q11 and Q13. When a bias current is not supplied from the bias current supplying circuit 3, both the current switching circuit 5 and emitter follower 6 stop operating, making the power consumption of the ECL gate circuit null.

Supplying a bias current to the ECL gate circuit 7 is controlled, as discussed previously, by the control signal $V_{CTL}$ input to the base of the transistor Q4.

The control signal $V_{CTL}$ is generated by the control signal generator 4 which has a fundamental circuit structure the same as the ECL gate circuit 7. In this example, in addition to the fundamental circuit as of the ECL circuit 7, there are added the diodes D1 to D3 and resistor R6 between the emitter of the transistor Q8 and the resistor R7. This addition takes into account the following point.

The ECL gate circuit 7 operates based upon the relative potential difference between the signal $V_{IN}$ and reference signal VR input to the bases of the transistors Q9 and Q10 of the current switching circuit 5, respectively. The control signal generator 4 having the same fundamental structure as the ECL gate circuit, also operates upon input of the signal VC and reference signal VR to the bases of the transistors Q5 and Q6. If the level of the signal VC is set to the same level of the signal VIN input to the ECL gate circuit 7, the circuit structure can be simplified. In this case, however, the potential at the emitter of the transistor Q8 is too high as the control signal $V_{CTL}$ to be inputted to the base of the current pulling-out transistor Q4. For this reason, the diodes D1 to D3 and resistor R6 are added to obtain a voltage drop.

As described above, according to the embodiment, a bias current is not supplied to one or more ECL gate circuits not operating among a plurality of ECL gate circuits, making the power consumption of non-operating circuits null and realizing a low power consumption of the whole system.

The above embodiment has been given only illustratively, and is not intended to limit the scope of the present invention. For example, the structures of the differential amplifier and negative feedback loop circuit are not limited to only those shown in FIG. 1, but other circuit structures may be used if they can supply to an external circuit a voltage which changes with an output voltage of the bias voltage source. Furthermore, means for dropping the potential at the node connected to the output terminal is not limited only to the transistor Q4 shown in FIG. 1, but other means capable of inhibiting a supply of a bias voltage to the external circuit may also be used.

An ECL gate circuit has been described as an object to be supplied with a bias current. The invention is also applicable to a memory constituted of bipolar transistors. In a memory, data read/write is performed only for a memory area designated by addresses. In this case, a bias current is not supplied to the non-selected memory area and address decoder, to effectively reduce power consumption.

As appreciated from the foregoing description of the present invention, the bias current supplying circuit has a differential amplifier having first to third nodes wherein a bias voltage from a bias voltage source is applied to the first node, and the potential at the third node is changed with a difference between potentials at the second node connected to the output terminal and at the first node, a negative feedback loop circuit for changing the potential at the second node in accordance with the potential at the third node, and a potential dropping means. It is therefore possible to supply a bias circuit to an external circuit in such a manner that the bias voltage source is directly connected to the external circuit, and not to supply a bias current by dropping the potential at the second node by using the potential dropping means, thereby reducing power consumption.

What is claimed is:

1. A bias current supplying circuit comprising:

a differential amplifier for amplifying a difference between potentials at first and second modes and outputting the amplified difference voltage from a third node, said first node being connected to an output terminal of a bias voltage source for outputting a bias voltage, and said second node being connected to an output terminal from which a bias current is supplied to an external circuit;

a negative feedback loop circuit for changing the potential at said second node in accordance with the potential at said third node of said differential amplifier; and potential dropping means connected to said second node for dropping the potential at said second node to intercept a supply of said bias current to said external circuit in the case where a control signal is input to said potential dropping means; and a control signal generator for generating the control signal and outputting the control signal to said potential dropping means in the case where said external circuit does not need said bias current.

2. The bias circuit supplying circuit according to claim 1, wherein;

in said differential amplifier, the potential at said third node rises when the potential at said first node rises above the potential at said second node, in accordance with a level difference between the potentials at said first and second nodes, and falls when the potential at said first node falls below the potential at said second node, in accordance with a level difference between the potentials at said first and second nodes; and in said negative feedback loop circuit, when the potential at said third node rises, the potential at said second node rises to a value substantially the same as the potential at said first node, and when the potential at said third node falls, the potential at said second node falls to a value substantially the same as the potential at said first node.

3. The bias current supplying circuit according to claim 2, wherein:

in said differential amplifier, a base of a first transistor is connected to said first node, a base of a second transistor is connected to said second node, emitters of said first and second transistors are connected in common via a first resistor to a second supply voltage terminal, a collector of said first transistor is connected to a first supply voltage terminal, a collector of said second transistor is connected to said third bode, and said third node is connected via a second resistor to said first supply voltage terminal;

in said negative feedback loop circuit, a base of a third transistor is connected to said third node, a collector of said third transistor is connected to said first supply voltage terminal, and an emitter of said third transistor is connected via a third resistor to said second node; and in said potential dropping means, a collector of a fourth transistor is connected to said second node, an emitter of said fourth transistor is connected to said second supply voltage terminal, and a base of said fourth transistor is connected to a terminal to which said control signal is input.

4. The bias current supplying circuit according to claim 3, wherein:

said third resistor of said feedback loop circuit has a resistance value which enables lowering a potential of said second node to a predetermined level for intercepting a supply of said bias current to said external circuit, when said fourth transistor assumes an on-state in response to said control signal.

5. The bias current supplying circuit according to claim 3, wherein said control signal generator comprises:
   a fifth transistor having a base connected to a terminal receiving a first reference signal and a collector connected to said first supply voltage terminal,
   a sixth transistor having a base connected to a terminal receiving a second reference signal for comparison with said first reference signal and a collector connected to a fourth node, said fourth node being connected via a fifth resistor to said first supply voltage terminal,
   a seventh transistor, emitters of said fifth and sixth transistors being connected in common to a collector of said seventh transistor, a base of said seventh transistor being connected to said first node and an emitter of said seventh transistor being connected via a fourth resistor to said second supply voltage terminal,
   an eighth transistor having a base connected to said fourth node, a collector connected to said first supply voltage terminal and an emitter connected via a sixth resistive element and a seventh resistive element in series with each other to said second supply voltage terminal, and
   wherein a fifth node connecting one end of said sixth resistive element and one end of said seventh resistive element is connected to the base of said fourth transistor.

6. The bias current supplying circuit according to claim 5, wherein:
   said third resistor of said negative feedback loop circuit has a resistance value which enables lowering a potential of said second node to a predetermined level for intercepting a supply of said bias current to said external circuit, when said fourth transistor assumes an on-state in response to said control signal.

7. The bias current supplying circuit according to claim 2, wherein said control signal generator comprises:
   a fifth transistor having a base connected to a terminal receiving a first reference signal and a collector connected to said first supply voltage terminal;
   a sixth transistor having a base connected to a terminal receiving a second reference signal for comparison with said first reference signal and a collector connected to a fourth node, said fourth node being connected via a fifth resistor to said first supply voltage terminal;
   a seventh transistor, emitters of said fifth and sixth transistors being connected in common to a collector of said seventh transistor, a base of said seventh transistor being connected to said first node and an emitter of said seventh transistor being connected via a fourth resistor to said second supply voltage terminal;
   an eighth transistor having a base connected to said fourth node, a collector connected to said first supply voltage terminal and an emitter connected via a sixth resistive element and a seventh resistive element in series with each other to said second supply voltage terminal, and
   wherein a fifth node connecting one end of said sixth resistive element and one end of said seventh resistive element outputs said control signal.

8. The bias current supplying circuit according to claim 1, wherein:
   in said differential amplifier, a base of a first transistor is connected to said first node, a base of a second transistor is connected to said second node, emitters of said first and second transistors are connected in common via a first resistor to a second supply voltage terminal, a collector of said first transistor is connected to a first supply voltage terminal, a collector of said second transistor is connected to said third node, and said third node is connected via a second resistor to said first supply voltage terminal;
   in said negative feedback loop circuit, a base of a third transistor is connected to said third node, a collector of said third transistor is connected to said first supply voltage terminal, and an emitter of said third transistor is connected via a third resistor to said second node; and
   in said potential dropping means, a collector of a fourth transistor is connected to said second node, an emitter of said fourth transistor is connected to said second supply voltage terminal, and a base of said fourth transistor is connected to a terminal to which said control signal is input.

9. The bias current supplying circuit according to claim 8, wherein:
   said third resistor of said feedback loop circuit has a resistance value which enables lowering a potential of said second node to a predetermined .level for intercepting a supply of said bias current to said external circuit, when said fourth transistor assumes an on-state in response to said control signal.

10. The bias current supplying circuit according to claim 8, wherein said control signal generator comprises:
   a fifth transistor having a base connected to a terminal receiving a first reference signal and a collector connected to said first supply voltage terminal,
   a sixth transistor having a base connected to a terminal receiving a second reference signal for comparison with said first reference signal and a collector connected to a fourth node, said fourth node being connected via a fifth resistor to said first supply voltage terminal,
   a seventh transistor, emitters of said fifth and sixth transistors being connected in common to a collector of said seventh transistor, a base of said seventh transistor being connected to said first node and an emitter of said seventh transistor being connected via a fourth resistor to said second supply voltage terminal,
   an eighth transistor having a base connected to said fourth node, a collector connected to said first supply voltage terminal and an emitter connected via a sixth resistive element and a seventh resistive element in series with each other to said second supply voltage terminal, and
   wherein a fifth node connecting one end of said sixth resistive element and one end of said seventh resistive element is connected to the base of said fourth transistor.

11. The bias current supplying circuit according to claim 10, wherein:

said third resistor of said negative feedback loop circuit has a resistance value which enables lowering a potential of said second node to a predetermined level for intercepting a supply of said bias current to said external circuit, when said fourth transistor assumes an on-state in response to said control signal.

12. The bias current supplying circuit according to claim 1, wherein said control signal generator comprises:

a fifth transistor having a base connected to a terminal receiving a first reference signal and a collector connected to said first supply voltage terminal, a sixth transistor having a base connected to a terminal receiving a second reference signal for comparison with said first reference signal and a collector connected to a fourth node, said fourth node being connected via a fifth resistor to said first supply voltage terminal, a seventh transistor, emitters of said fifth and sixth transistors being connected in common to a collector of said seventh transistor, a base of said seventh transistor being connected to said first node, and an emitter of said seventh transistor being connected via a fourth resistor to said second supply voltage terminal, an eighth transistor having a base connected to said fourth node, a collector connected to said first supply voltage terminal, and an emitter connected via a sixth resistive element and a seventh resistive element in series with each other to said second supply voltage terminal, and wherein a fifth node connecting one end of said sixth resistive element and one end of said seventh resistive element outputs said control signal.

* * * * *